(12) United States Patent
Cui et al.

(10) Patent No.: US 8,853,674 B2
(45) Date of Patent: Oct. 7, 2014

(54) TUNNELING FIELD EFFECT TRANSISTOR STRUCTURE AND METHOD FOR FORMING THE SAME

(75) Inventors: Ning Cui, Beijing (CN); Renrong Liang, Beijing (CN); Jing Wang, Beijing (CN); Jun Xu, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/640,929

(22) PCT Filed: Aug. 28, 2012

(86) PCT No.: PCT/CN2012/080654
§ 371 (c)(1),
(2), (4) Date: Oct. 12, 2012

(87) PCT Pub. No.: WO2013/063975
PCT Pub. Date: May 10, 2013

(65) Prior Publication Data
US 2013/0105764 A1    May 2, 2013

(30) Foreign Application Priority Data

Oct. 31, 2011   (CN) .......................... 2011 1 0338222

(51) Int. Cl.
*H01L 29/775* (2006.01)
*H01L 29/786* (2006.01)
*H01L 29/739* (2006.01)

(52) U.S. Cl.
CPC ...... *H01L 29/78603* (2013.01); *H01L 29/7391* (2013.01)
USPC .............................. 257/27; 257/192; 438/306

(58) Field of Classification Search
CPC ............ H01L 29/7391; H01L 29/1079; H01L 29/78603

USPC ........... 257/192, 288, 27; 438/306, 307, 194, 438/305
See application file for complete search history.

(56) References Cited

U.S. PATENT DOCUMENTS

| 5,274,257 | A | 12/1993 | Kim et al. | |
| 7,839,209 | B2 * | 11/2010 | Curatola et al. | ............... 327/566 |
| 2012/0305988 | A1 * | 12/2012 | Wang et al. | ................... 257/192 |

FOREIGN PATENT DOCUMENTS

| CN | 101699617 A | 4/2010 |
| CN | 102214684 A | 10/2011 |
| CN | 102354708 A | 2/2012 |

OTHER PUBLICATIONS

CN102214684, Oct. 2011.*
International Search Report for Application No. PCT/CN2012/080654 dated Nov. 29, 2012.

* cited by examiner

*Primary Examiner* — Whitney T Moore
(74) *Attorney, Agent, or Firm* — Lerner, David, Littenberg, Krumholz & Mentlik, LLP

(57) ABSTRACT

A tunneling field effect transistor structure and a method for forming the same are provided. The tunneling field effect transistor structure comprises: a substrate; a plurality of convex structures formed on the substrate, every two adjacent convex structures being separated by a predetermined cavity less than 30 nm in width, the convex structures comprising a plurality of sets, and each set comprising more than two convex structures; a plurality of floated films formed on tops of the convex structures, each floated film corresponding to one set of convex structures, a region of each floated film corresponding to a top of an intermediate convex structure in each set being formed as a channel region, and regions of the each floated film at both sides of the channel region are formed as a source region and a drain region with opposite conductivity types respectively; and a gate stack formed on each channel region.

7 Claims, 3 Drawing Sheets

TUNNELING FIELD EFFECT TRANSISTOR STRUCTURE AND METHOD FOR FORMING THE SAME

CROSS-REFERENCE OF RELATED APPLICATIONS

The present application is a national phase entry under 35 U.S.C. §371 of International Application No. PCT/CN2012/080654 filed Aug. 28, 2012, which claims priority from Chinese Patent Application 201110338222.0, filed Oct. 31, 2011, all of which are incorporated herein by reference.

FIELD

The present disclosure relates to semiconductor manufacture and design, and more particularly to a tunneling field effect transistor structure and a method for forming the same.

BACKGROUND

For a long time, in order to achieve a higher chip density, a faster operating speed and a lower power consumption, a feature size of a metal-oxide-semiconductor field effect transistor (MOSFET) is continuously scaled down according to Moore's law, and currently has reached a nanometer level. However, a serious challenge is an emergence of a short-channel effect, such as a subthreshold voltage roll-off ($V_t$ roll-off), a drain-induced barrier lowering (DIBL) and a source-drain punch through, thus significantly increasing an off-state leakage current. Therefore, a performance of the MOSFET may be deteriorated.

At present, in order to reduce the negative influence of short-channel effect, a variety of improvements have been proposed, especially the tunneling field effect transistor (TFET). When the MOSFET device is in a subthreshold state, the device is of weak inversion type, and the main conductive mechanism is thermoelectron emission. Therefore, the MOSFET's subthreshold slope at room temperature is limited to 60 mV/dec. Compared with a conventional MOSFET, on the one hand, because an active region of the TFET device is substantially a tunneling junction, the TFET has a weaker short-channel effect or even has no short-channel effect; on the other hand, because a main current mechanism of the TFET is band-to-band tunneling and an exponential relationship is formed between a drain current and an applied gate-source voltage in a subthreshold region and a saturation region, the TEFT has a lower subthreshold slope, and a drain current is almost independent of a temperature.

A method for forming a TFET is compatible with a method for a conventional complementary metal-oxide-semiconductor field effect transistor (CMOSFET). The structure of a TFET device is based on a metal-oxide-semiconductor gated P-I-N diode. FIG. 1 is a cross-sectional view of a conventional TFET with an n-type channel. Particularly, the conventional TFET comprises a p-type doped source region 1000', an n-type doped drain region 2000', a channel region 3000' between the p-type doped source region 1000' and the n-type doped drain region 2000', and a gate stack 4000' which comprises a gate dielectric layer formed on the channel region 3000' and a gate electrode formed on the gate dielectric layer.

When the TFET is turned off, that is, no gate voltage is applied, a junction formed between the source region 1000' and the drain region 2000' is a reverse biased diode, and a potential barrier created by the reverse biased diode is greater than that created by a conventional complementary MOSFET, thus greatly reducing a subthreshold leakage current and a direct tunneling current of the TFET even if a channel length is very short. When a voltage is applied to a gate in the TFET, under an action of a field effect, an electron channel may be formed in the channel region 3000'. Once an electron concentration in the channel region 3000' is degenerated, a tunneling junction will be formed between the source region 1000' and the channel region 3000', and a tunneling current generated by carrier tunneling will pass through the tunneling junction. From the perspective of an energy band, with the tunneling field effect transistor based on a gated P-I-N diode, a tunnel length of a P-N junction formed between the source region 1000' and the channel region 3000' is adjusted by controlling the voltage of the gate.

The shortcomings of the conventional TFET in the prior art are that the performance of the conventional TFET is not satisfactory yet, in particular, the source-drain capacitance may result in an increase in a delay of digital circuits.

SUMMARY

The present disclosure is aimed to solve at least one of the above mentioned technical problems, particularly, to reduce a capacitance of a source-drain parasitic junction of a TFET and increase an operating speed of a device.

According to an aspect of the present disclosure, a TFET structure is provided. The TFET structure comprises: a substrate; a plurality of convex structures formed on the substrate, in which every two adjacent convex structures are separated by a predetermined cavity less than 30 nm in width, the plurality of convex structures comprise a plurality of sets, and each set comprises more than two convex structures; a plurality of floated films formed on tops of the plurality of convex structures, in which each floated film corresponds to one set of convex structures, a region of each floated film corresponding to a top of an intermediate convex structure in each set is formed as a channel region, and regions of the each floated film at both sides of the channel region are formed as a source region and a drain region with opposite conductivity types respectively; and a gate stack formed on each channel region.

In one embodiment, a material of the substrate is Si or SiGe, and a material of each floated film is a semiconductor material such as Si, $Si_{1-x}C_x$, SiGe, Ge or III-V group compounds.

In one embodiment, a material of each convex structure is a semiconductor material such as Si, SiGe, Ge or III-V group compounds.

In one embodiment, the source region comprises a heavily doped p-type region, the channel region is a weakly doped p-type region, a weakly doped n-type region or an intrinsic region, and the drain region is a heavily doped n-type region, that is, an n-type TFET is formed. In this embodiment, the tunneling field effect transistor structure further comprises a first region which is a heavily doped n-type region formed between the source region and the channel region, in which a width of the first region in a direction from the source region to the drain region is less than 5 nm. The first region of the source region of the n-type TFET which is adjacent to the channel region may shorten the length of the electron tunneling, reduce the subthreshold slope of the device, and increase the on-state current of the device.

In another embodiment, the source region comprises a heavily doped n-type region, the channel region is a weakly doped n-type region, a weakly doped p-type region or an intrinsic region, and the drain region is a heavily doped p-type region, that is, a p-type TFET is formed. In this embodiment, the tunneling field effect transistor structure further comprises a second region which is a heavily doped p-type region formed between the source region and the channel region, in which a width of the second region in a direction from the source region to the drain region is less than 5 nm. The second region of the source region of the p-type TFET which is adjacent to the channel region may shorten the length of the electron tunneling, reduce the subthreshold slope of the device, and increase the on-state current of the device.

In one embodiment, the convex structures are multi-layer structures, in which a material of a top layer of each multi-layer structure is a semiconductor material such as Si, $Si_{1-x}C_x$, SiGe, Ge or III-V group compounds, thus improving the performance of the device.

In one embodiment, the floated films are formed on the convex structures by annealing the plurality of convex structures at a temperature of 900-1200 degrees Celsius in an ambient containing hydrogen to form a semiconductor film and then etching a part of the semiconductor film between two adjacent sets of convex structures to divide the semiconductor film into the plurality of floated films. Preferably, when the material of each floated film comprises SiGe or Ge, the ambient further contains at least one gas selected from a group consisting of $SiH_4$, $GeH_4$, $SiH_2Cl_2$, and $SiHCl_3$; or when the material of each floated film comprises III-V group compounds, the ambient further contains an III-V group reaction gas.

In one embodiment, each set of convex structures comprises three convex structures.

In another embodiment, each set of convex structures comprises four convex structures, and regions of each floated film corresponding to tops of a second convex structure and a third convex structure in each set are formed as channel regions, so as to form two TFET devices with a common source region or a common drain region.

In one embodiment, the TFET structure further comprises a sidewall of one or more layers formed on both sides of the gate stack.

According to another aspect of the present disclosure, a method for forming a TFET structure is provided. The method comprises steps of: providing a substrate; forming a plurality of convex structures on the substrate, in which every two adjacent convex structures are separated by a predetermined cavity less than 30 nm in width, the convex structures comprise a plurality of sets, and each set comprises more than two convex structures; forming a plurality of floated films on tops of the plurality of convex structures, in which each floated film corresponds to one set of convex structures; forming a region of each floated film corresponding to a top of an intermediate convex structure in each set as a channel region and forming regions of the each floated film at both sides of the channel region as a source region and a drain region with opposite conductivity types respectively; and forming a gate stack on each channel region.

In one embodiment, a material of the substrate is Si or SiGe, and a material of each floated film is a semiconductor material such as Si, $Si_{1-x}C_x$, SiGe, Ge or III-V group compounds, thus improving the performance of the device.

In one embodiment, a material of each convex structure is a semiconductor material such as Si, SiGe, Ge or III-V group compounds.

In one embodiment, the convex structures are multi-layer structures, in which a material of a top layer of each multi-layer structure is a semiconductor material such as Si, $Si_{1-x}C_x$, SiGe, Ge or III-V group compounds.

In one embodiment, in order to form an n-type TFET, the region of the each floated film corresponding to the top of the intermediate convex structure in each set is weakly doped p-type, weakly doped n-type or intrinsic so as to form the channel region, a region of the each floated film at one side of the channel region is heavily doped p-type so as to form the source region, and a region of the each floated film at the other side of the channel region is heavily doped n-type so as to form the drain region. In this embodiment, the method further comprises a step of: forming a first region which is a heavily doped n-type region by doping an end of the source region adjacent to the channel region after the channel region is formed, in which a width of the first region in a direction from the source region to the drain region is less than 5 nm.

In another embodiment, in order to form a p-type TFET, the region of the each floated film corresponding to the top of the intermediate convex structure in each set is weakly doped n-type, weakly doped p-type or intrinsic so as to form the channel region, a region of the each floated film at one side of the channel region is heavily doped n-type so as to form the source region, and a region of the each floated film at the other side of the channel region is heavily doped p-type so as to form the drain region. In this embodiment, the method further comprises a step of: forming a second region which is a heavily doped p-type region by doping an end of the source region adjacent to the channel region after the channel region is formed, in which a width of the second region in a direction from the source region to the drain region is less than 5 nm.

In one embodiment, the floated films are formed by annealing the plurality of convex structures at a temperature of 900-1200 degrees Celsius in an ambient containing hydrogen to form a semiconductor film and then etching a part of the semiconductor film between two adjacent sets of convex structures to divide the semiconductor film into the plurality of floated films. In one embodiment, the annealing is laser annealing or high temperature rapid thermal annealing. Preferably, when the material of each floated film comprises SiGe or Ge, the ambient further contains at least one gas selected from a group consisting of $SiH_4$, $GeH_4$, $SiH_2Cl_2$, and $SiHCl_3$; or when the material of each floated film comprises III-V group compounds, the ambient further contains an III-V group reaction gas.

In one embodiment, the floated films are formed by performing an epitaxy on the tops of the plurality of convex structures to form a semiconductor film and then etching a part of the semiconductor film between two adjacent sets of convex structures to divide the semiconductor film into the plurality of floated films.

In one embodiment, the method further comprises a step of forming a sidewall of one or more layers on both sides of the gate stack.

According to an embodiment of the present disclosure, the TFET structure is formed by using floated films as a source region and a drain region respectively. In this way, on one hand, dopants in a source and a drain may be prevented from diffusing into a substrate, so that an ultra-shallow junction may be easy to fabricate. On the other hand, the source and the drain may not contact with the substrate, thus inhibiting off-state leakage between the source and the substrate and between the drain and the substrate. Furthermore, because a source-drain capacitance of a small size TFET is mainly constituted by the capacitance between the source region and the substrate and/or between the drain region and the substrate, the source-drain capacitance of the TFET structure according to an embodiment of the present disclose can be effectively reduced by using the floated source and the floated drain, thus improving the operating speed of the device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
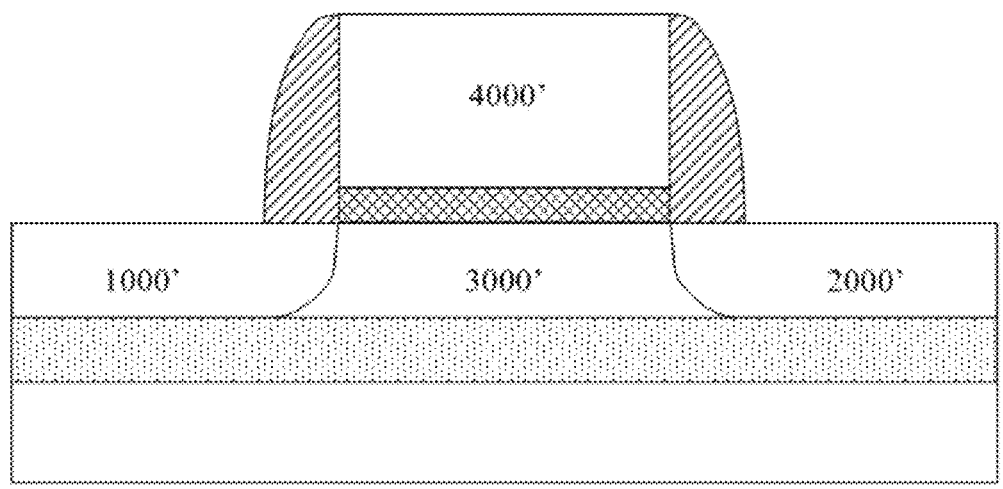
FIG. 1 is a cross-sectional view of a conventional n-type TFET structure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature, and may also include an embodiment in which an additional feature is formed between the first feature and the second feature so that the first feature does not directly contact the second feature.

Figure 2:
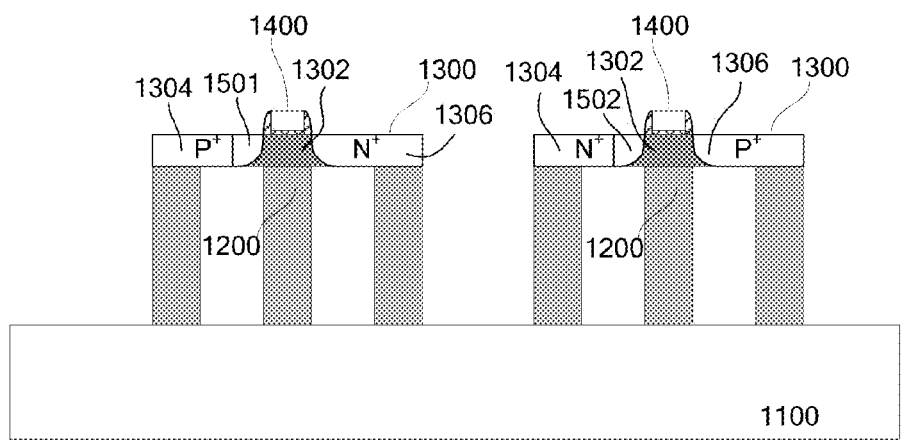
FIG. 2 is a cross-sectional view of a TFET structure according to an embodiment of the present disclosure.

FIG. 2 is a cross-sectional view of a TFET structure according to an embodiment of the present disclosure. The TFET structure comprises a substrate 1100, and a plurality of convex structures 1200 formed on the substrate 1100, in which every two adjacent convex structures 1200 are separated by a predetermined cavity less than 30 nm in width, preferably, less than 15 nm in width. The plurality of convex structures 1200 comprise a plurality of sets, and each set comprises more than two convex structures 1200. The TFET structure according to an embodiment of the present disclosure may be applied to a small size device, particularly used for alleviating a leakage of a small size device. The TFET structure further comprises a plurality of floated films 1300 formed on tops of the convex structures 1200, in which each floated film 1300 corresponds to one set of convex structures 1200. A region of each floated film 1300 corresponding to a top of an intermediate convex structure 1200 in each set is formed as a channel region 1302, and regions of the each floated film 1300 at both sides of the channel region 1302 are formed as a source region 1304 and a drain region 1306 with opposite conductivity types respectively.

Particularly, with regard to an n-type TFET, the source region 1304 comprises a heavily doped p-type region, the channel region 1302 is a weakly doped p-type region, a weakly doped n-type region or an intrinsic region, and the drain region 1306 is a heavily doped n-type region. The tunneling field effect transistor structure may further comprise a first region 1501 which is a heavily doped n-type region formed between the source region 1304 and the channel region 1302, and a width of the first region 1501 in a direction from the source region 1304 to the drain region 1306 is less than 5 nm.

With regard to a p-type TFET, the source region 1304 comprises a heavily doped n-type region, the channel region 1302 is a weakly doped n-type region, a weakly doped p-type region or an intrinsic region, and the drain region 1306 is a heavily doped p-type region. The tunneling field effect transistor structure may further comprise a second region 1502 which is a heavily doped p-type region formed between the source region 1304 and the channel region 1302, and a width of the second region 1502 in a direction from the source region 1304 to the drain region 1306 is less than 5 nm.

The first region of the n-type TFET or the second region of the p-type TFET may shorten the length of the electron tunneling, reduce the subthreshold slope of the device, and increase the on-state current of the device.

The TFET structure further comprises a gate stack 1400 formed on each channel region 1302. The gate stack 1400 comprises a gate dielectric layer, for example, a high k gate dielectric layer, and a gate electrode.

In this embodiment, as shown in FIG. 2, there are two independent TFETs, each TFET form a device, and the two devices are isolated from each other. Specifically, the floated film 1300 between the two TFETs is etched out to form the two devices isolated from each other. In this embodiment, each independent TFET comprises three convex structures 1200, i.e., a first convex structure, a second convex structure and a third convex structure, in which a region of each floated film 1300 corresponding to a top of the second convex structure (i.e., the intermediate convex structure) is formed as a channel region 1302, a region of the each floated film 1300 from a top of the first convex structure to the channel region 1302 is formed as a source region 1304, a region of the floated film 1300 from the channel region 1302 to a top of the third convex structure is formed as a drain region 1306. As shown in FIG. 2, the two independent TFETs are an n-type TFET and a p-type TFET respectively.

In one embodiment, a material of the substrate 1100 is Si or SiGe, and a material of each floated film 1300 is a semiconductor material such as Si, $Si_{1-x}C_x$, SiGe, Ge or III-V group compounds, thus improving the performance of the device.

In one embodiment, a material of each convex structure 1200 is a semiconductor material such as Si, SiGe, Ge or III-V group compounds. Therefore, the plurality of floated films 1300 may be formed on the convex structures by annealing the plurality of convex structures 1200. Because annealing the convex structures 1200 may make the surface atoms migrate and make the tops of two adjacent convex structures 1200 contact with each other to form a semiconductor film, the floated films 1300 can be formed by annealing the plurality of convex structures 1200 at a temperature of 900-1200 degrees Celsius in an ambient containing hydrogen to form a semiconductor film and then etching a part of the semiconductor film between two adjacent sets of convex structures 1200 to divide the semiconductor film into the plurality of floated films 1300. Preferably, in order to get better result, when the material of each floated film 1300 comprises SiGe or Ge, the ambient further contains at least one gas selected from a group consisting of $SiH_4$, $GeH_4$, $SiH_2Cl_2$, and $SiHCl_3$; or when the material of each floated film 1300 comprises III-V group compounds, the ambient further contains an III-V group reaction gas. In some embodiments, the floated films 1300 are very thin, and are below about 20 nm.

Figure 3:
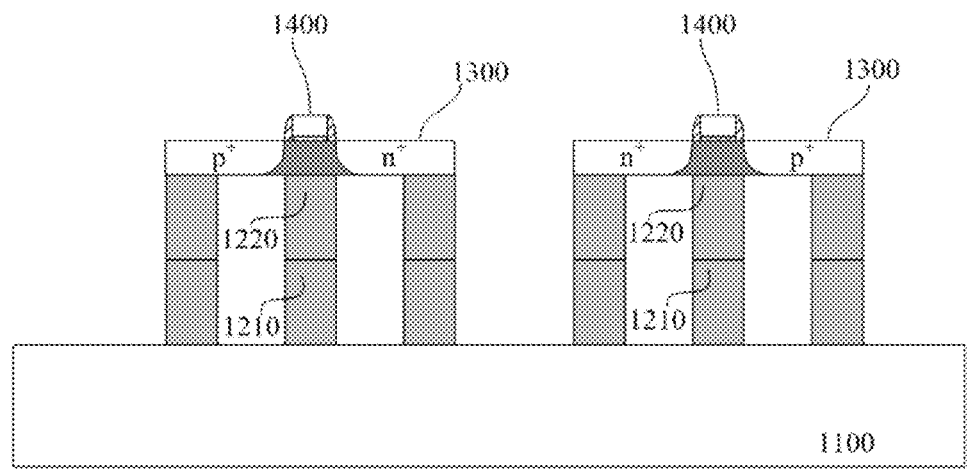
FIG. 3 is a cross-sectional view of a TFET structure according to another embodiment of the present disclosure.

In another embodiment, the convex structures 1200 are multi-layer structures, in which a material of a top layer of each multi-layer structure is a semiconductor material such as Si, $Si_{1-x}C_x$, SiGe, Ge or III-V group compounds. FIG. 3 is a cross-sectional view of a TFET structure according to another embodiment of the present disclosure, in which the convex structures 1200 are multi-layer structures, and the material of the top layer of each multi-layer structure is $Si_{1-x}C_x$, SiGe, Ge or III-V group compounds. With regard to FIG. 3, each convex structure 1200 comprises a SiGe layer 1210, and a Ge layer 1220.

In one embodiment, the TFET structure further comprises a sidewall of one or more layers formed on both sides of the gate stack 1400, which can extend the interface layers between the source and the channel and between the drain and the channel into the convex structures, so as to improve the interface characteristics of the junction and further improve the performance of the device.

Figure 4:
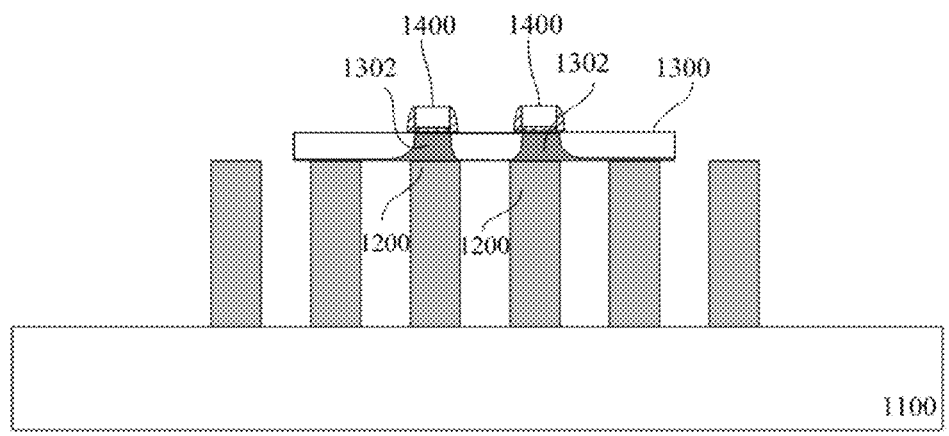
FIG. 4 is a cross-sectional view of a TFET structure with a common source region or a common drain region according to an embodiment of the present disclosure.

In other embodiments, as shown in FIG. 4, there may be two TFETs having a common source region or a common drain region. In these embodiments, each set of convex structures 1200 comprises four convex structures, i.e., a first convex structure, a second convex structure, a third convex structure and a fourth convex structure, and regions of each floated film 1300 corresponding to tops of the second convex structure and the third convex structure in each set are formed as two channel regions 1302 with opposite conductivity types respectively. Because the two TFETs have a common source region or a common drain region, as shown in FIG. 4, the non-common source region of one TFET and the non-common drain region of the other TFET have opposite conductivity types.

Figure 5:
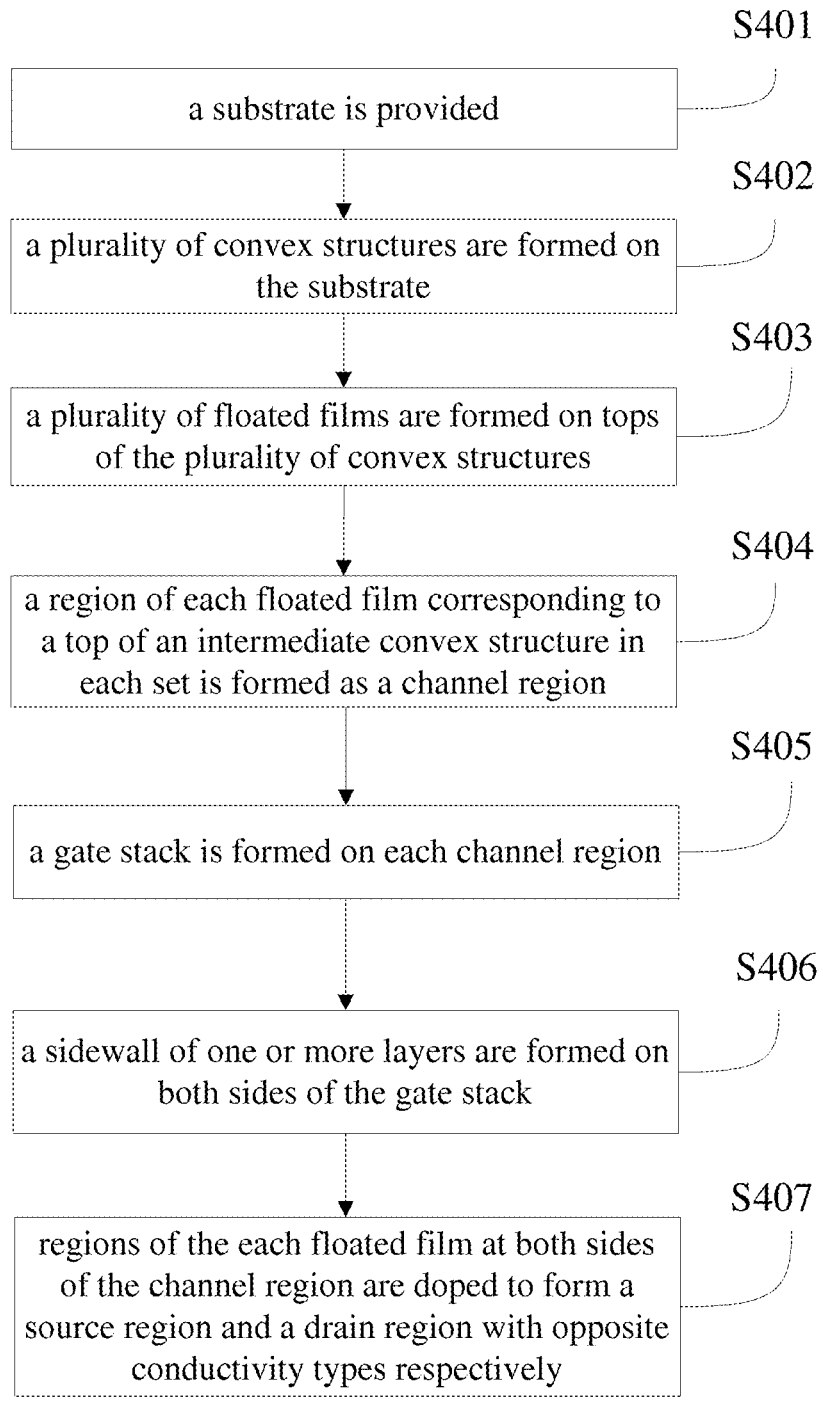
FIG. 5 is a flow chart of a method for forming a TFET structure according to an embodiment of the present disclosure.

FIG. 5 is a flow chart of a method for forming a TFET structure according to an embodiment of the present disclosure. The method comprises the following steps.

In step S401, a substrate is provided. A material of the substrate is Si or SiGe.

In step S402, a plurality of convex structures are formed on the substrate, in which every two adjacent convex structures are separated by a predetermined cavity less than 30 nm in width, preferably less than 15 nm in width. The convex structures comprise a plurality of sets, and each set comprises more than two convex structures. Particularly, in some embodiments, at least one semiconductor layer is deposited on the substrate, and then the at least one semiconductor layer is etched to form the plurality of convex structures, in which a material of the at least one semiconductor layer is a semiconductor material such as Si, SiGe, Ge or III-V group compounds. Certainly, in other embodiments, a surface layer of the substrate is directly etched to form the plurality of convex structures. Preferably, in order to control a shape of the plurality of convex structures, a combination of an anisotropic wet etching and a dry etching can be adopted.

In step S403, a plurality of floated films are formed on tops of the plurality of convex structures, in which a material of each floated film is a semiconductor material such as Si, $Si_{1-x}C_x$, SiGe, Ge or III-V group compounds, thus improving the performance of the device.

In one embodiment, a material of each convex structure is a semiconductor material such as SiGe, Ge or III-V group compounds. Therefore, the plurality of floated films may be formed by annealing the plurality of convex structures. Because annealing the convex structures may make the surface atoms migrate and make the tops of two adjacent convex structures contact with each other to form a semiconductor film, the floated films may be formed by annealing the plurality of convex structures at a temperature of 900-1200 degrees Celsius in an ambient containing hydrogen to form a semiconductor film and then etching a part of the semiconductor film between two adjacent sets of convex structures to divide the semiconductor film into the plurality of floated films. Preferably, in order to get a flat surface, when the material of each convex structure comprises SiGe or Ge, the ambient further contains at least one gas selected from a group consisting of $SiH_4$, $GeH_4$, $SiH_2Cl_2$, and $SiHCl_3$; or when the material of each convex structure comprises III-V group compounds, the ambient further contains an III-V group reaction gas.

In another embodiment, the semiconductor film may also be formed by an epitaxy. In some embodiments, the wafer may be a Si wafer, a $Si_{1-x}C_x$ wafer, a SiGe wafer or a Ge wafer with a surface of a crystal orientation (100). Because a lateral epitaxial growth rate of the semiconductor film with a certain crystal orientation is not less than a longitudinal growth rate thereof, a gap between tops of two adjacent convex structures may be quickly sealed up by epitaxial materials. Therefore, a part of the semiconductor film may be spaced apart from the substrate. In another embodiment, if the semiconductor film is formed by an epitaxy, the semiconductor film may also be an III-V group compound semiconductor layer.

In one embodiment, the convex structures are multi-layer structures, in which a material of a top layer of each multi-layer structure is a semiconductor material such as Si, $Si_{1-x}C_x$, SiGe, Ge or III-V group compounds.

In one embodiment, if the floated films after the annealing are relatively thick, the floated films may be further subjected to etching or thinning treatment.

In step S404, a region of each floated film corresponding to a top of an intermediate convex structure in each set is formed as a channel region. The channel region may be an intrinsic region, a p-type doped region, or an n-type doped region. For example, in order to form an n-type TFET, the region of the each floated film corresponding to the top of the intermediate convex structure may be weakly doped p-type, weakly doped n-type or intrinsic to form the channel region; while in order to form a p-type TFET, the region of the floated film corresponding to the top of the intermediate convex structure in each set may be weakly doped n-type, weakly doped p-type or intrinsic to form the channel region.

In step S405, a gate stack is formed on each channel region.

In step S406, a sidewall of one or more layers are formed on both sides of the gate stack.

In step S407, regions of the each floated film at both sides of the channel region are doped to form a source region and a drain region with opposite conductivity types respectively. For example, in order to form an n-type TFET, a region of the each floated film on one side of the channel region may be heavily doped p-type to form a source region, and a region of the each floated film on the other side of the channel region may be heavily doped n-type to form a drain region. In one embodiment, after the source region is formed, an end of the source region adjacent to the channel region may be further doped to form a first region which is a heavily doped n-type region, and a width of the first region in a direction from the source region to the drain region is less than 5 nm. The first region of the n-type TFET may shorten the length of the electron tunneling, reduce the subthreshold slope of the device, and increase the on-state current of the device. In order to form a p-type TFET, a region of the each floated film on one side of the channel region may be heavily doped n-type to form a source region, and a region of the each floated film on the other side of the channel region may be heavily doped p-type to form a drain region. In one embodiment, after the source region are formed, an end of the source region adjacent to the channel region may be further doped to form a second region which is a heavily doped p-type region, and a width of the second region in a direction from the source region to the drain region is less than 5 nm. The second region of the p-type TFET may shorten the length of the electron tunneling, reduce the subthreshold slope of the device, and increase the on-state current of the device.

According to an embodiment of the present disclosure, the TFET structure is formed by using floated films as a source region and a drain region respectively. In this way, on one hand, dopants in a source and a drain may be prevented from diffusing into a substrate, so that an ultra-shallow junction may be easy to fabricate. On the other hand, the source and the drain may not contact with the substrate, thus inhibiting off-state leakage between the source and the substrate and between the drain and the substrate. Furthermore, because a source-drain capacitance of a small size TFET is mainly constituted by the capacitance between the source region and the substrate and/or between the drain region and the substrate, the source-drain capacitance of the TFET structure according to an embodiment of the present disclose can be effectively reduced by using the floated source and the floated drain, thus improving the operating speed of the device.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A tunneling field effect transistor structure, comprising:
   a substrate;
   a plurality of convex structures formed on the substrate, wherein every two adjacent convex structures are separated by a predetermined cavity less than 30 nm in width, the plurality of convex structures comprise a plurality of sets, and each set comprises more than two convex structures;
   a plurality of floated films formed on tops of the plurality of convex structures, wherein each floated film corresponds to one set of convex structures, a region of each floated film corresponding to a top of an intermediate convex structure in each set is formed as a channel region, and regions of each floated film at both sides of the channel region are formed as a source region and a drain region with opposite conductivity types respectively; and
   a gate stack formed on each channel region,
   wherein the source region comprises a heavily doped p-type region, the channel region is a weakly doped p-type region, a weakly doped n-type region or an intrinsic region, the drain region is a heavily doped n-type region, and the tunneling field effect transistor structure further comprises a first region which is a heavily doped n-type region formed between the source region and the channel region, wherein a width of the first region in a direction from the source region to the drain region is less than 5 nm; or
   wherein the source region comprises a heavily doped n-type region, the channel region is a weakly doped n-type region, a weakly doped p-type region or an intrinsic region, the drain region is a heavily doped p-type region, and the tunneling field effect transistor structure further comprises a second region which is a heavily doped p-type region formed between the source region and the channel region, wherein a width of the second region in a direction from the source region to the drain region is less than 5 nm.

2. The tunneling field effect transistor structure according to claim 1, wherein the convex structures are multi-layer structures.

3. The tunneling field effect transistor structure according to claim 1, wherein each set comprises three convex structures.

4. The tunneling field effect transistor structure according to claim 1, wherein each set comprises four convex structures, and regions of each floated film corresponding to tops of a second convex structure and a third convex structure in each set are formed as channel regions.

5. A method for forming a tunneling field effect transistor structure, comprising steps of:
   providing a substrate;
   forming a plurality of convex structures on the substrate, wherein every two adjacent convex structures are separated by a predetermined cavity less than 30 nm in width, the convex structures comprise a plurality of sets, and each set comprises more than two convex structures;
   forming a plurality of floated films on tops of the plurality of convex structures, wherein each floated film corresponds to one set of convex structures;
   forming a region of each floated film corresponding to a top of an intermediate convex structure in each set as a channel region and forming regions of each floated film at both sides of the channel region as a source region and a drain region with opposite conductivity types respectively; and
   forming a gate stack on each channel region,
   wherein the region of each floated film corresponding to the top of the intermediate convex structure in each set is weakly doped p-type, weakly doped n-type or intrinsic so as to form the channel region, a region of each floated film at one side of the channel region is heavily doped p-type so as to form the source region, a region of each floated film at the other side of the channel region is heavily doped n-type so as to form the drain region, and the method further comprises forming a first region which is a heavily doped n-type region by doping an end of the source region adjacent to the channel region after the channel region is formed, wherein a width of the first region in a direction from the source region to the drain region is less than 5 nm; or
   wherein the region of each floated film corresponding to the top of the intermediate convex structure in each set is weakly doped n-type, weakly doped p-type or intrinsic so as to form the channel region, a region of each floated film at one side of the channel region is heavily doped n-type so as to form the source region, a region of each floated film at the other side of the channel region is heavily doped p-type so as to form the drain region, and the method further comprises forming a second region which is a heavily doped p-type region by doping an end of the source region adjacent to the channel region after the channel region is formed, wherein a width of the second region in a direction from the source region to the drain region is less than 5 nm.

6. The method according to claim 5, wherein the plurality of floated films are formed by annealing the plurality of convex structures at a temperature of 900-1200 degrees Celsius in an ambient containing hydrogen to form a semiconductor film and then etching a part of the semiconductor film between two adjacent sets of convex structures to divide the semiconductor film into the plurality of floated films.

7. The method according to claim 5, wherein the plurality of floated films are formed by performing an epitaxy on the tops of the plurality of convex structures to form a semiconductor film and then etching a part of the semiconductor film between two adjacent sets of convex structures to divide the semiconductor film into the plurality of floated films.

* * * * *